United States Patent [19]

Nakaya et al.

[11] Patent Number: 4,755,707
[45] Date of Patent: Jul. 5, 1988

[54] INPUT DEVICE

[75] Inventors: Chitose Nakaya, Tokyo; Hiroshi Takeuchi, Matsudo; Kageyoshi Katakura, Tokyo, all of Japan

[73] Assignees: Hitachi Metals, Ltd.; Hitachi Medical Corp; Hitachi, Ltd., all of Tokyo, Japan

[21] Appl. No.: 944,523

[22] Filed: Dec. 22, 1986

[30] Foreign Application Priority Data

Dec. 25, 1985 [JP] Japan ............................ 60-290657

[51] Int. Cl.$^4$ ............................ H01L 41/08
[52] U.S. Cl. ........................ 310/334; 310/357; 310/358; 310/366
[58] Field of Search ............ 310/800, 334, 335, 336, 310/337, 338, 366, 357, 358, 359

[56] References Cited

U.S. PATENT DOCUMENTS

| | | | |
|---|---|---|---|
| 4,234,813 | 11/1980 | Iguchi et al. | 310/800 X |
| 4,240,002 | 12/1980 | Tosi et al. | 310/334 X |
| 4,404,489 | 9/1983 | Larson, III et al. | 310/334 |
| 4,412,148 | 10/1983 | Klicker et al. | 310/800 X |
| 4,459,850 | 7/1984 | Hyanova et al. | 310/334 X |
| 4,473,769 | 9/1984 | Nguyen | 310/800 X |
| 4,518,889 | 5/1985 | Hoen | 310/357 |
| 4,572,981 | 2/1986 | Zola | 310/800 X |
| 4,613,784 | 9/1986 | Haun et al. | 310/358 |
| 4,628,223 | 12/1986 | Takeuchi et al. | 310/800 X |
| 4,658,176 | 4/1987 | Nakaya et al. | 310/358 X |

OTHER PUBLICATIONS

Transverse Honeycomb Composite Transducers, by Safari et al, Mat. Res. Bull., vol. 17, No. 3, Mar. 1982, pp. 301-308.

*Primary Examiner*—Mark O. Budd
*Attorney, Agent, or Firm*—Antonelli, Terry & Wands

[57] ABSTRACT

An input device such as a keyboard or a tablet for input of pattern employing a piezoelectric material/polymer 1-3 composite of the structure in which a number of rods of piezoelectric material are buried in a polymer.

5 Claims, 1 Drawing Sheet

INPUT DEVICE

BACKGROUND OF THE INVENTION

The present invention relates to an input device that is adapted to computers, electronic typewriters and word processors.

A variety of types of keyboard switches have heretofore been proposed using organic piezoelectric materials. For example, a document No. 114 in the "1977 Joint Convention Record of Four Institutes of Electrical Engineers, Japan" discloses devices to constitute input devices such as a keyboard and a tablet for input of picture by using a polyvinylidene fluoride (PVDF) or a PZT/polymer 0-3 composite composed of a polymer blended with a powder of lead zirconate titanate (PZT) or the like. However, since the PVDF or the PZT/polymer 0-3 composite has a homogeneous composition, use of a material that is wholly polarized gives rise to the occurrence of crosstalk relative to the neighboring keys. Therefore, a considerably cumbersome step is required to constitute a keyboard by effecting local polarization to be suitable for a printed circuit in the keyboard. As for a tablet for input of picture, furthermore, a method has been developed to detect the position of a vibrating pen relying upon electrodes at four places without, however, satisfactory results in regard to resolution and quick response.

A piezoelectric material/polymer 1-3 composite, on the other hand, is used as an ultrasonic probe of a diagnostic ultrasound equipment.

The method of producing the piezoelectric material/polymer 1-3 composite of this type has been disclosed in a journal "Sensor Technology", Vol. 2, No. 7, p. 84, FIG. 6, June, 1982 (Japan).

The method of producing the piezoelectric material/polymer 1-3 composite of this kind has also been proposed in U.S. Ser. No. 661,928 that was filed previously by the inventors of the present invention.

SUMMARY OF THE INVENTION

The object of the present invention is to provide an input device which permits little crosstalk to take place and which can be realized in a small size.

The piezoelectric material/polymer 1-3 composite (hereinafter simply referred to as "1-3 composite") has the structure in which rods 101 of piezoelectric material are buried in many number in a polymer 102 as shown in FIG. 1. Therefore, the coupling is very weak in the lateral direction. According to the Present invention, the above 1-3 composite is used to constitute an input device. The present invention makes it possible to realize the input device having superior performance to the existing piezoelectric materials such as of PVDF. The present invention further provides the input device having an optimum structure constituted by the 1-3 composite.

DETAILED DESCRIPTION OF THE PREFERRED EMBODIMENTS

Figure 1:
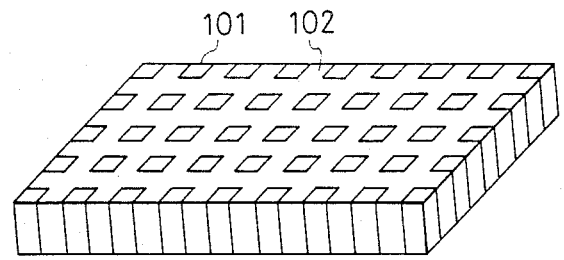
FIG. 1 is a perspective view showing a 1-3 composite employed in the present invention.
Figure 2:
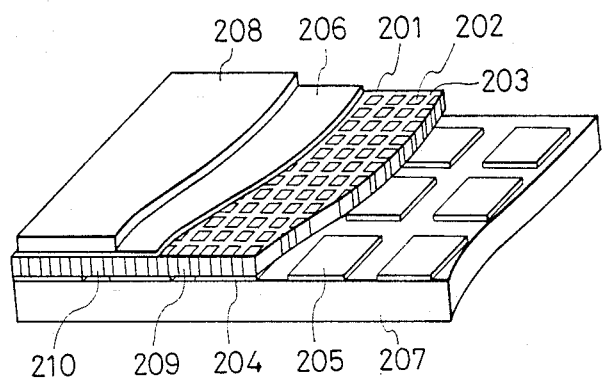
FIG. 2 is a perspective view showing the structure of a keyboard according to an embodiment of the present invention.

Embodiments of the invention will now be described. FIG. 2 shows an embodiment in which a keyboard is constituted using a 1-3 composite 201. Reference numeral 202 denotes rods of piezoelectric material (PZT) that have been polarized, 203 denotes a polymer (polyurethane), reference numerals 204 and 205 denote electrodes (copper foils) for detecting signals, 206 denotes an earth electrode (deposited Cr-Au film), 207 denotes a printed circuit board (epoxy board) on which signal detecting electrodes have been formed, and reference numeral 208 denotes a coating layer (polyurethane).

On the coating layer 208 are provided a plurality of keys to correspond to signal detecting electrodes 204 and 205.

As the surface of the coating layer 208 on the signal detecting electrodes 204, 205 is struck by a key, signals are generated on the signal detecting electrodes 204 and 205. To take out the signals from the signal detecting electrodes 204 and 205, through holes are formed in the printed circuit board 207. With the conventional keyboard comprised of the PVDF or the like, polarization must be effected to be in agreement with the signal detecting electrodes. With the 1-3 composite which has small coupling in the lateral direction, on the other hand, the polarizaiton may have been effected in advance, making it possible to easily constitute a keyboard having good performance and in a small size. In the embodiment of FIG. 2, use is made of the 1-3 composite in which rods of piezoelectric material (PZT rods) each measuring 1.0×1.0 mm are buried maintaining a distance of 2.0 mm, and signal detecting electrodes each measuring 5×5 mm are arranged maintaining a distance of 8 mm, to constitute a keyboard.

In FIG. 2, the rods 209 and 210 of piezoelectric material do not correspond to the signal detecting electrodes and are, hence, unnecessary rods. These unnecessary rods may often become a cause of coupling. Without providing the rods 209 and 210, therefore, a keyboard can be constituted having improved performance.

Figure 3:
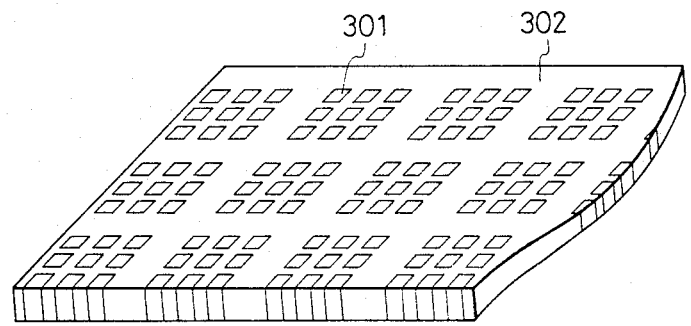
FIG. 3 is a perspective view showing the 1-3 composite according to another embodiment adapted to the keyboard.

FIG. 3 illustrates a 1-3 composite which is so constructed that rods 301 of piezoelectric material (PZT rods) exist only in areas under which the signal detecting electrodes will be located, and which does not contain unnecessary rods of piezoelectric material. Here, reference numeral 302 denotes a polymer (polyurethane). Using the 1-3 composite of FIG. 3, the keyboard is constructed in a manner as shown in FIG. 2 so that the rods of piezoelectric material exist on the signal detecting electrodes only. Though FIG. 2 has exemplified the keyboard, it is also allowable to constitute a touch sensitive input device and a tablet for input of picture in the same manner. In the case of the touch sensitive input device, the signal detecting electrodes should have a large size, and in the case of the tablet for input of picture, the signal detecting electrodes should have a small size.

The tablet for input of picture exhibits the greatest resolution when it is so constructed that the signals are taken out from each of the rods of piezoelectric material. It is allowable to prepare a 1-3 composite of the structure in which the rods of piezoelectric material each measuring about 0.1×0.1 mm are buried maintaining a distance of 0.2 mm. The best resolution in this case is 0.2 mm. If a picture or a character is written with a suitable writing pressure on the coating layer 208, signals are produced on the underlying signal detecting electrodes. Thus, it is possible to constitute a tablet for input of picture having good resolution and quick response.

According to the conventional tablet for input of picture, vibration of a vibrating pen is detected by four electrodes placed at corner portions, and the position of pen is determined by processing the signals, exhibiting poor response. Moreover, the signals change depending upon the writing pressure.

With the tablet for input of picture of the present invention, the writing pressure can also be displayed if it is combined with a suitable apparatus. The picture can be input relying not only upon the pressure but also upon the vibration (in this case, the pattern is described using a vibrating pen).

Further, if use is made of rods of piezoelectric material having a high pyroelectricity, the picture can be input using the heat, making it possible to fabricate an infrared detector with the structure shown in FIG. 2.

The present invention makes it possible to easily fabricate input devices such as a keyboard, a touch sensitive input device, a tablet for input of picture, an infrared detector, and like devices having high performance by using a piezoelectric material/polymer 1-3 composite, presenting great industrial values.

What is claimed is:
1. An input device comprising:
   a piezoelectric material/polymer 1-3 composite which consists of a polymer and a number of rods of piezoelectric material buried in the polymer;
   a common electrode provided on one surface of said piezoelectric material/polymer 1-3 composite; and
   a plurality of signal detecting electrodes that are independently provided on the other surface of said piezoelectric material/polymer 1-3 composite, wherein said rods of piezoelectric material are not provided at places where no signal detecting electrode is provided.
2. An input device according to claim 1, wherein said input device further comprises a coating layer provided on a surface of said common electrode.
3. An input device according to claim 1, wherein said input device further comprises a printed circuit board on which said plurality of signal detecting electrodes are formed.
4. An input device according to claim 1, wherein said rods of piezoelectric material are located only vertically above the signal detecting electrodes.
5. An input device according to claim 1, wherein said rods of piezoelectric material exhibit pyroelectricity, whereby an infrared detector can be provided.

* * * * *